(12) United States Patent
Holland

(10) Patent No.: US 7,271,468 B2
(45) Date of Patent: Sep. 18, 2007

(54) HIGH-VOLTAGE COMPATIBLE, FULL-DEPLETED CCD

(75) Inventor: Stephen Edward Holland, Hercules, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/357,769

(22) Filed: Feb. 16, 2006

(65) Prior Publication Data

US 2006/0180834 A1 Aug. 17, 2006

Related U.S. Application Data

(60) Provisional application No. 60/654,057, filed on Feb. 16, 2005.

(51) Int. Cl.
*H01L 23/58* (2006.01)
(52) U.S. Cl. ............ 257/648; 257/519; 257/400; 257/460; 257/447; 257/442; 257/452
(58) Field of Classification Search ............ 257/409, 257/648, 519, 400, 460, 447, 442, 452
See application file for complete search history.

(56) References Cited

U.S. PATENT DOCUMENTS 6,025,585 A 2/2000 Holland 6,259,085 B1 7/2001 Holland
6,917,041 B2 7/2005 Doty et al.
2005/0139833 A1 6/2005 Janesick et al.

OTHER PUBLICATIONS

Holland, "High-Voltage Compatible, Fully Depleted CCD," Lawrence Berkeley National Laboratory, Technology Transfer, web site 2 pages, (Sep. 22, 2004).
Holland et al., "Development of High-Voltage Compatible, Fully Depleted, Back-Illuminated Charge Coupled Devices," Lawrence Berkeley National Laboratory, Engineering Division, p. 1-3, (Sep. 2004).
Kleinfelder et al., "Integrated X-Ray and Charged Particle Active Pixel CMOS Sensor Arrays Using an Epitaxial Silicon Sensitive Region," Lawrence Berkeley National Laboratory, Proceedings of SPIE, p. 1-10, (2002).
Burke et al., "CCD Soft-X-Ray Detectors with Improved High- and Low-Energy Permformance," IEEE Transactions on Nuclear Science, vol. 51 (No. 5), p. 2322-2327, (Oct. 2004).

(Continued)

*Primary Examiner*—Douglas M. Menz
(74) *Attorney, Agent, or Firm*—R'Sue P. Caron; Lawrence Berkeley National Laboratory

(57) ABSTRACT

A charge coupled device for detecting electromagnetic and particle radiation is described. The device includes a high-resistivity semiconductor substrate, buried channel regions, gate electrode circuitry, and amplifier circuitry. For good spatial resolution and high performance, especially when operated at high voltages with full or nearly full depletion of the substrate, the device can also include a guard ring positioned near channel regions, a biased channel stop, and a biased polysilicon electrode over the channel stop.

12 Claims, 12 Drawing Sheets

OTHER PUBLICATIONS

Spieler, "Imaging Detectors and Electronics—A View of the Future," Lawrence Berkeley National Laboratory, Physics Division, Paper 55525, p. 1-24, (Jun. 16, 2004).

Holland et al., "Development of Back-Illuminated, Fully-Depleted CCD Image Sensors for Use in Astronomy and Astrophysics," Lawrence Berkeley National Laboratory, Engineering Division, p. 1-4, (1997).

Holland, "An Overview of CCD Development at Lawrence Berkeley National Laboratory,"Lawrence Berkeley National Laboratory, Engineering Division, p. 1-7, (Oct. 2002).

Holland et al., "Fully Depleted, Back-Illuminated Charge-Coupled Devices Fabricated on High-Resistivity Silicon," IEE Transactions on Electron Devices, vol. 50 (No. 1), p. 225-238, (Jan. 2003).

Rusu et al., "Deep-Depletion Breakdown Voltage of Silicon-Dioxide/Sillicon MOS Capacitors," IEEE Transactions on Electron Devices, vol. 26 (No. 3), p. 201-205, (Mar. 1979).

Nishizawa et al., "Field-Effect Transistor Versus Analog Transistor (Static Induction Transistor)," IEEE Transactions on Electron Devices, vol. 22 (No. 4), p. 185-197, (Apr. 1975).

Richter et al., "Strip Detector Design for Atlas and Hera-B Using Two-Dimensional Device Simulation," Nuclear Instruments and Methods in Physics Research A, vol. 377, p. 412-421, (1996).

Wei et al., "Effect of Floating-Body Charge on SOI MOSFET Design," IEEE Transactions on Electron Devices, vol. 45 (No. 2), p. 430-438, (Feb. 1998).

Parker, "A Proposed VLSI Pixel Device for Particle Detection," Nuclear Instruments and Methods in Physics Research A, vol. 275, p. 494-516, (1989).

HIGH-VOLTAGE COMPATIBLE, FULL-DEPLETED CCD

CROSS-REFERENCE TO RELATED APPLICATIONS

This application claims priority to U.S. Patent Provisional Application 60/654,057, filed Feb. 16, 2005, which is incorporated by reference herein.

STATEMENT OF GOVERNMENTAL SUPPORT

The invention described and claimed herein was made in part utilizing funds supplied by the U.S. Department of Energy under Contract No. DE-AC03-76SF00098, and more recently under DE-AC02-05CH11231. The government has certain rights in this invention.

BACKGROUND OF THE INVENTION

Field of the Invention

The invention relates generally to charge coupled devices (CCDs), and more particularly to high-voltage compatible, full-depleted CCDs.

Charge coupled devices (CCDs), which were originally developed as computer memory, are widely used as imaging detectors, in fields ranging from astronomy to medicine. Incident light is converted to electronic charge in a CCD, the charge is collected in potential wells, transferred out, detected, and stored. Images are then produced from the stored data. In a CCD, the electronic circuitry and gates are formed on one side of a silicon wafer, the front side; the opposite side of the wafer is the back side.

U.S. Pat. No. 6,259,085, which is included by reference herein, describes a CCD fabricated on a high-resistivity substrate that uses a substrate bias voltage to fully deplete the substrate. The result from the combination of a thick substrate and a substrate bias voltage that fully depletes the substrate is a high-performance CCD with good quantum efficiency in the near-infrared portion of the spectrum. The fully depleted substrate also results in good spatial resolution, since photo-generated carriers drift in an electric field. The spatial resolution is described in terms of the point spread function (PSF). Conventional back-illuminated CCDs typically have a field-free region that degrades the PSF.

The PSF has been shown to be proportional to the CCD thickness and inversely proportional to the square root of the substrate bias voltage. For some applications the required PSF implies the use of relatively high voltages. In some applications, an rms PSF of about 4 µm is desired. For a 200 µm thick substrate this implies operation at a substrate bias of about 80V. However, bias voltages of this magnitude introduce concerns about the long-term reliability of the CCD since this voltage is comparable to the dielectric breakdown voltage of the gate insulator used in the CCD channels and on-chip transistors. In addition, achieving functionality at such high voltages is not trivial.

Operating CCDs at high substrate bias voltages also allows for thicker, fully depleted CCDs. Thick CCDs could have applications in direct detection of low-energy x-rays. FIG. 1 shows calculated x-ray absorption probability versus x-ray energy for varying silicon thickness. As shown in FIG. 1, x-ray absorption is a strong function of thickness. A typical thickness for conventional back-illuminated CCDs is 20 µm. The x-ray absorption efficiency 100 is very poor for a 20 µm device, however. The absorption efficiency 110 improves for a 200 µm thick device. A 650 µm thick CCD has a greatly improved absorption efficiency 120 for 20 keV x-rays. A standard thickness for 150 mm diameter silicon wafers used to make CCDs is 650-675 µm. However, since the substrate bias voltage necessary for full depletion (depletion voltage) is proportional to the square of thickness, fully-depleting such a CCD requires a substantial voltage. The estimated depletion voltage for a 650 µm thick CCD with a substrate resistivity of 6000 Ω-cm is approximately 235V. The depletion voltage will scale approximately inversely proportional to resistivity, so a CCD fabricated on a 650 µm thick, 4000 Ω-cm substrate requires a depletion voltage of (1.5×235) or approximately 352V.

There is therefore a need to develop a CCD that can be reliably operated at high substrate bias voltages.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

The present invention is directed to charge coupled devices (CCDs) on thick substrates, which have structural features that enable the CCDs to operate reliably with high substrate bias voltages without risk of breakdown. High substrate bias voltages can effect full depletion (or partial depletion) of CCDs on thick substrates. The full depletion of a thick CCD results in good spatial resolution, since photo-generated carriers drift in an electric field.

Some of the basic features of the present invention in accordance with the embodiments of the present invention are described in U.S. Pat. No. 6,259,085, the disclosure of which is herein incorporated by reference in its entirety for all purposes.

In the following disclosure, the embodiments of the invention are described for an n-type substrate. It should be understood that the description is also meant to include embodiments for a p-type substrate in which conductivity types of all regions are also opposite to those described for the n-type substrate. A "+" symbol or the word "plus" denotes heavy doping, and a double plus "++" denotes very heavy doping. A "−" symbol or the word "minus" denotes light doping, and a double minus "−−" denotes very light doping.

In the following disclosure, the embodiments of the invention are described for a silicon substrate. It should be understood that the description is also meant to include embodiments for other semiconductor materials that can be used to make electronic, especially charge coupled, devices.

The CCDs disclosed herein are radiation detectors; they are configured to detect both electromagnetic radiation and particle radiation. CCDs radiation detection includes spatial resolution and images of the detected radiation are usually formed. It is useful to make CCDs on thick substrates so that most of the radiation impinging on the detector is detected and does not just pass through the device without interacting. Greater thickness increases the probability of interaction between the radiation and the device.

Figure 1:
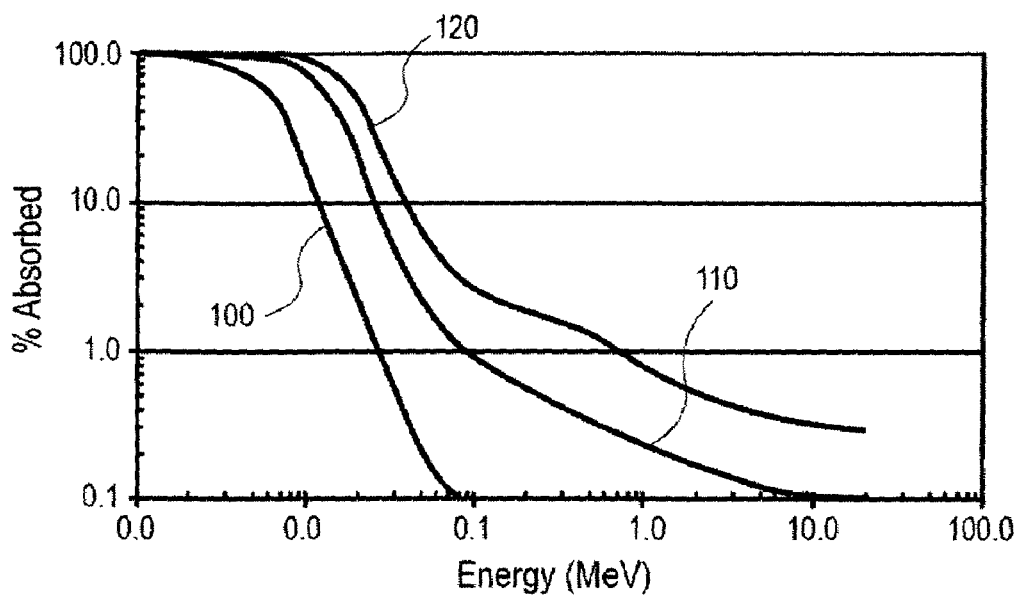
FIG. 1 is a graph of the calculated x and γ-ray absorption probability as a function of energy for silicon for various thicknesses.
Figure 2:
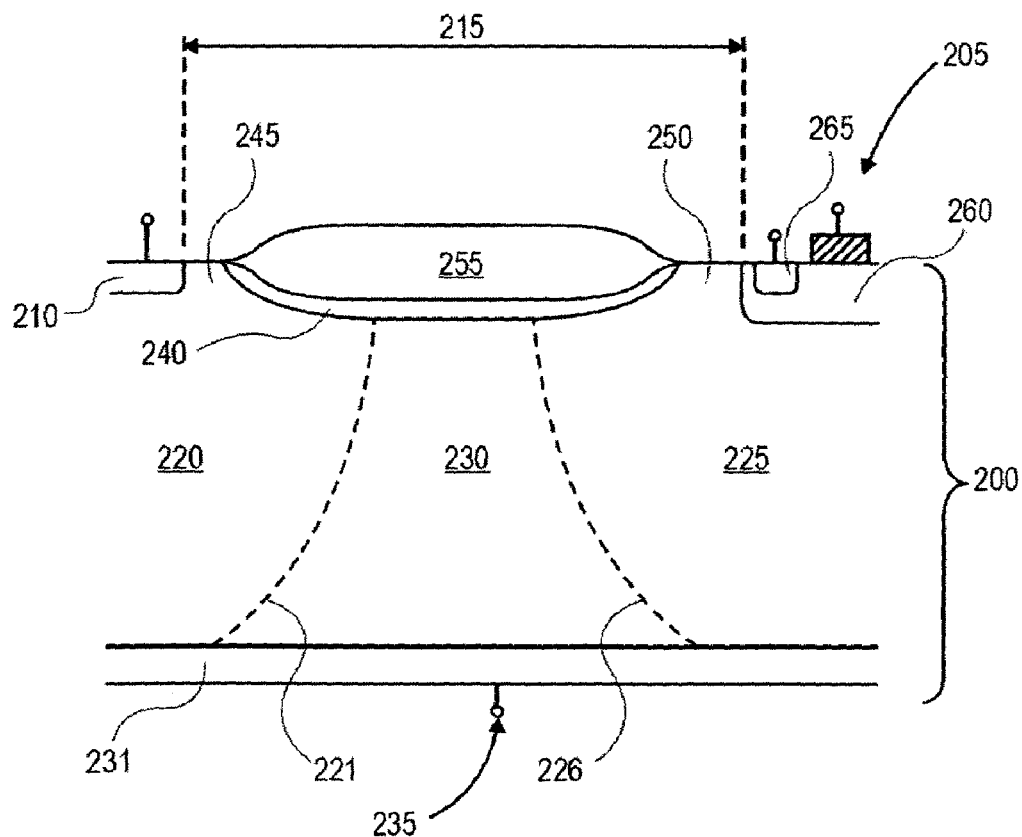
FIG. 2 is an exemplary cross-sectional sketch of a CCD with p+ guard ring and p-channel output transistor. N-type channel stop regions are formed under silicon dioxide (referred to as the field oxide). A p buffer region extends beyond and to the left of the source of the transistor, and unimplanted regions with no intentional doping other than the background doping of the substrate are between the channel stop and p+/p buffer regions.

FIG. 2 shows a cross-sectional view of a portion of a CCD according to some embodiments of the invention. As discussed above, in this example, the substrate 200 is n-type. The portion of the CCD includes some amplifier circuitry or an output transistor 205. There is an n-type implanted region 240 (same conductivity type as the substrate 200, but higher doping) which is referred to as the channel stop region 240. The channel stop 240 is isolated from p+ region or guard ring 210 by unimplanted region 245. The channel stop 240 is isolated from p+ source region 265 by unimplanted region 250. Isolation regions 245, 250 help to avoid a low-breakdown voltage situation. There are depletion regions 220, 225 associated with the p+ regions 210, 265, respectively. Above the channel stop 240 is a silicon dioxide (SiO$_2$) layer 255 that is referred to as the field oxide 255. In a standard Local Oxidation of Silicon (LOCOS) process the channel stop 240 implant is self-aligned to what later becomes the field oxide 255. The extended p-type region 260 around the more heavily doped source 265 is referred to as the p buffer region 260. The distance 215 between the output transistor 205 and the nearest guard ring 210 is large enough to prevent depletion regions 220, 225 from merging, thus creating an undepleted region 230 therebetween. The undepleted region 230 is bounded by the depletion edges 221, 226. The potential in the undepleted region 230 is essentially the same as substrate bias voltage 235 (neglecting ohmic drops in the undepleted silicon 230 due to dark current and/or photo-generated charge).

As the substrate bias voltage 235 is increased, the potential that is close to the sensitive regions of the CCDs (e.g., output transistor 205, pixels (not shown)) increases, and at some point is cause for concern. High electric fields near sensitive regions of the CCDs can result in avalanche breakdown and can render the CCD non-functional. Improper sequencing of voltages can result in permanent failure when high voltages are present near sensitive regions of the CCD.

As described above, U.S. Pat. No. 6,259,085 disclosed a CCD fabricated on a high-resistivity substrate that used a substrate bias voltage to deplete the substrate fully. In a fully depleted substrate 200, the depletion regions 220 and 225 extend to backside n+ layer 231. As used herein, in a "partially depleted" substrate 200, the depletion regions 220, 225 merge in the region of the substrate 200 below the channel stop 240, but do not extend completely to the backside n+ layer 231. There is an undepleted region 230 adjacent the backside n+ layer 231, which penetrates only a small distance into the substrate 200. Partially depleted is used here to mean that the depletion regions do not extend to the back side of the substrate, with the region between the depletion edge and the back side of the substrate being a region of electrical neutrality with no electric field. A fully depleted or partially depleted CCD is a high performance CCD with good quantum efficiency and good spatial resolution as photo generated carriers drift in response to an electric field created as a result of a substrate bias voltage that is sufficient to fully or partially deplete the substrate.

In one embodiment of the invention, a fully or partially depleted CCD is effected by positioning the guard ring 210 close enough to the amplifier circuitry or output transistor 205 (or other sensitive region of the CCD, such as a buried channel region) to cause merging of depletion regions 220 225 In some arrangements, a portion of the guard ring is positioned approximately 1 μm to 100 μm from at least one channel region. In some arrangements, a portion of the guard ring is positioned approximately 1 μm to 70 μm from the amplifier circuitry. In another arrangement, bias voltages to the guard ring, the CCD transistor gates and the substrate are adjusted to merge the associated depletion regions.

When the depletion regions 220 and 225 in FIG. 2 merge and the CCD is fully depleted, the undepleted region 230 and the depletion edges 221, 226 disappear; the depletion regions 220, 225 are continuous below the channel stop 240. Thus the channel stop 240 is electrically isolated and acquires a floating potential that depends on the width of the channel stop region 240, the substrate bias voltage 235, and the substrate 200 doping level. Electric fields associated with the floating potential, especially the fields at the surface, may be high enough to cause avalanche breakdown which can render the CCD nonfunctional.

Thus it is important to reduce the electric fields as much as possible. Some embodiments of the invention involve adjusting the structure of the CCD to minimize the floating potential on the channel stops for CCDs that are fully or partially fully depleted and operate under high substrate bias. The adjustments can include narrowing the width of the channel stop regions and fully depleting the channel stops. Although the adjustments can be useful in reducing the floating potential (and thus, the field), often a non-negligible, residual electric field remains. Other embodiments of the invention are directed to mitigating the effects of the residual electric field. Mitigating features can include unimplanted regions adjacent guard rings, buffer regions adjacent guard rings, field plates, and contacts to the channel stops for applying an external bias, Contacts to the channel stops for applying an external bias can also mitigate undesirable effects that can arise when the channel stops are electrically floating.

Figure 3:
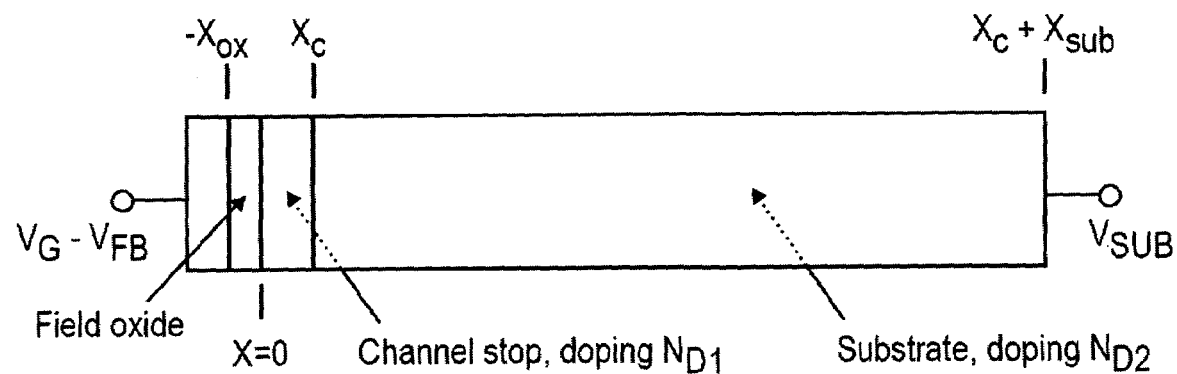
FIG. 3 is an exemplary diagram showing a simplified cross-section through a polycrystalline gate electrode over a channel stop region. A field oxide layer is between the polycrystalline electrode and the channel stop region.

The surface potential at the silicon-silicon dioxide ($SiO_2$) interface for a fully depleted channel stop is approximately given by $$V_{surface} \approx V_G - V_{FB} + \frac{qN_{D1}x_c}{C_{ox}} \quad (1)$$

where $V_G$ is the voltage applied to the Metal-Oxide Semiconductor (MOS) capacitor gate electrode, $V_{FB}$ is the flat band voltage, q is the electronic charge, $N_{D1}$ is the channel stop doping density, $x_c$ is the channel stop layer thickness, and $C_{ox}$ is the oxide capacitance per unit area given by $\epsilon_{ox}/x_{ox}$ where $\epsilon_{ox}$ and $x_{ox}$ are the permittivity (dielectric constant) and thickness of the $SiO_2$ field oxide layer between the polycrystalline silicon gate and the substrate. The above equation is derived from a one-dimensional solution to the Poisson Equation, where the depletion approximation was used. Similarly, the potential at the lower edge of the channel stop is given by $$V(x_c) \approx V_G - V_{FB} + \frac{qN_{D1}x_c}{C_{ox}} + \frac{qN_{D1}x_c^2}{2\varepsilon_{silicon}} \quad (2)$$

where $\epsilon_{silicon}$ is the permittivity of silicon. This result is approximately independent of the substrate bias voltage, which can be explained by referring to FIG. 3. FIG. 3 shows a cross section through a channel stop region. For the high-resistivity substrates considered here, $N_{D1}$ is typically orders of magnitude greater than $N_{D2}$, the doping in the substrate. $N_{D1}$, the doping level in the channel stop, is of the order of $10^{16}$ cm$^{-3}$, while 6000 Ω-cm silicon corresponds to an $N_{D2}$ value of $7.7 \times 10^{11}$ cm$^{-3}$. The ratio is roughly 4 orders of magnitude. The electric field due to the space charge in the depleted areas is given by the charge enclosed in a Gaussian box, or $qN_D x/\epsilon_{silicon}$ where $qN_D x$ is the charge per unit area in a Gaussian box of thickness x and volumetric doping density $N_D$, which is assumed to be depleted of mobile charges.

At the silicon surface at X=0 the electric field is dominated by the depleted charge in the channel stop, even though the channel stop thickness is much less than the substrate thickness. The channel stop is typically about a micron thick, while the substrate thickness of interest here ranges from about 200 to about 650 μm. The 4 orders of magnitude difference in doping density dominates over the factor of 200 to 650 in thickness. At the field oxide/silicon interface at X=0 the electric flux is constant, or in terms of electric field $$\epsilon_{ox}E_{ox} = \epsilon_{silicon}E_{silicon} \quad (3)$$

where $E_{ox}$ is the electric field in the $SiO_2$, and $E_{silicon}$ is the field at the silicon surface. Equation (1) can be derived from (3) assuming the surface field in the silicon is dominated by the charge in the fully depleted channel stop, and that $E_{ox}$ is constant and given by the voltage drop across the oxide divided by the oxide thickness. The 3$^{rd}$ and 4$^{th}$ terms in Equation (2) are the voltage drops across the field oxide and channel stop, respectively.

Hence according to Equations (1) and (2) the potential at the silicon surface and at the edge of the channel stop is approximately independent of substrate bias when the channel stop is fully depleted and the substrate doping is much less than the channel stop doping.

Figure 4:
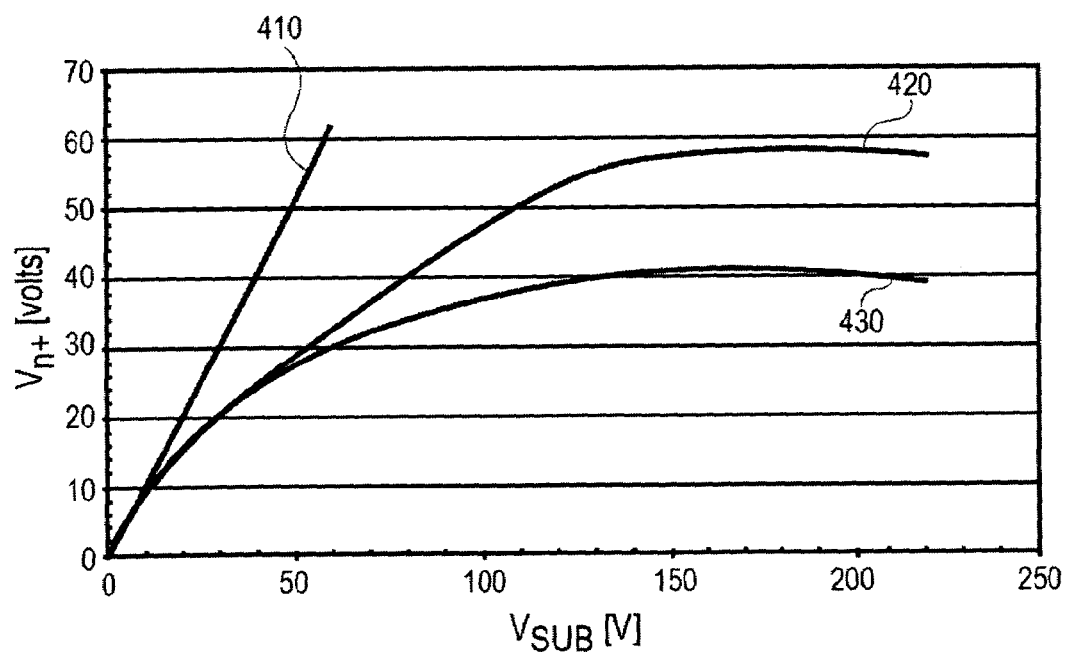
FIG. 4 is a graph of measured channel stop potential Vn+ as a function of substrate bias $V_{SUB}$ measured on CCDs fabricated on high-resistivity silicon. These devices were fabricated on 650 µm thick substrates with some thinned to approximately 250 µm.
Figure 7:
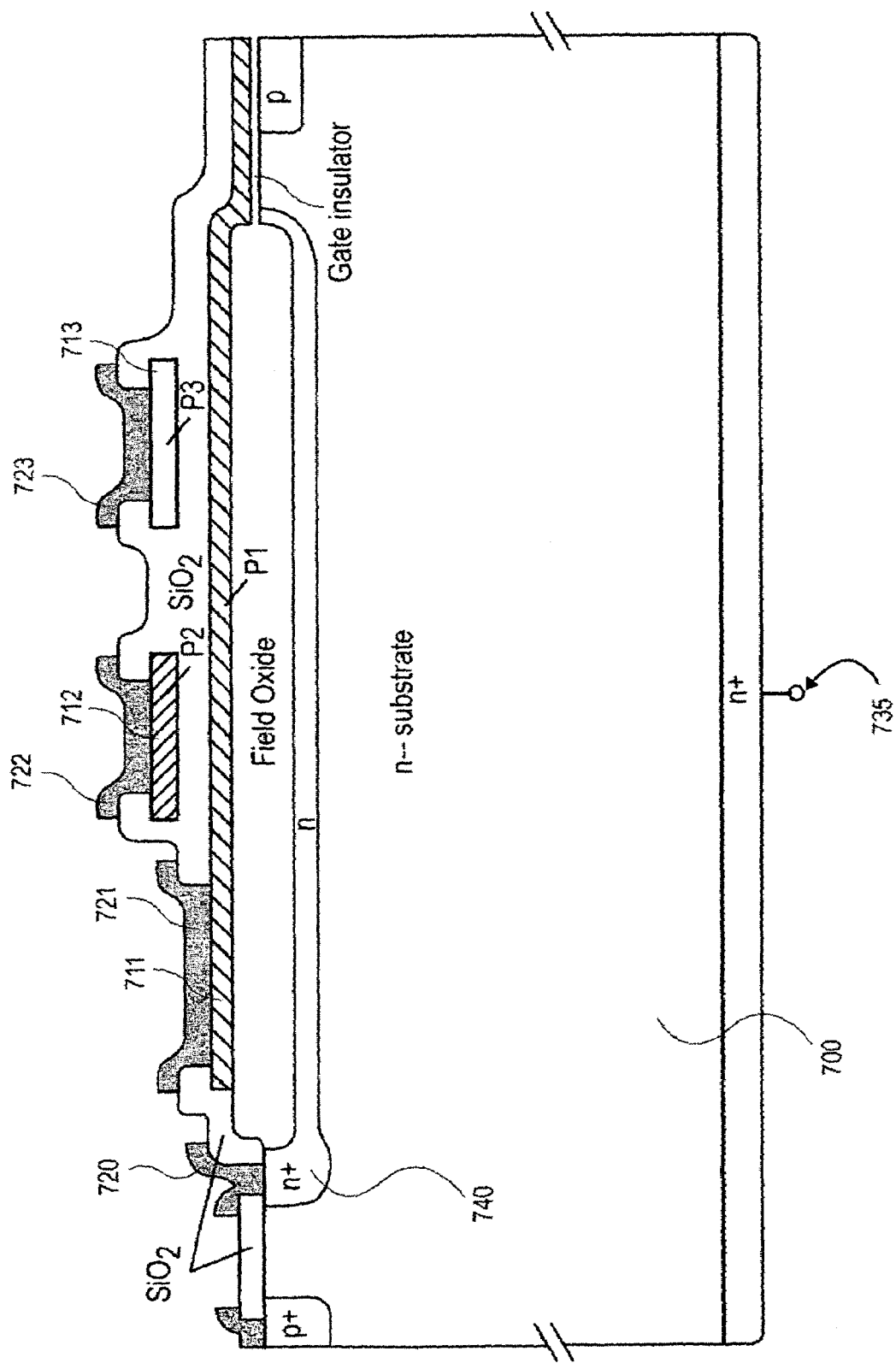
FIG. 7 is a simplified simulation cross section of the vertical clock bus region for CCDs according to an embodiment of the invention. The $n^+$ implant makes contact to the channel stop allowing simulation of the floating potential of the channel stop region via current source biasing at that contact.

FIG. 4 shows experimentally measured floating potentials on CCDs with channel stop contacts along a 2 pixel wide line running through the center of the imaging area, thereby splitting the image area into halves. The potential was measured with a high-impedance electrometer using a CCD external pin that was electrically connected to channel stops in the vicinity of polycrystalline silicon gate electrodes that bring in the gate electrodes for the imaging pixels (FIG. 7). Curve 410 is relevant to a low voltage device with neither merged depletion regions nor fully depleted channel stops where $V_{n+}$ equals $V_{SUB}$. Curve 420 shows the potential for a device with a thick field oxide; curve 430 shows the potential for a device with a thin field oxide. The region on the curves in FIG. 4 where the floating potential is approximately constant may be due to full depletion of the channel stops, as described below.

Using Equation (2), the expected potential difference of the floating channel stop region due to the difference in field oxide thickness is calculated, where $$V(x_c)_{thick} - V(x_c)_{thin} = (x_{ox,thick} - x_{ox,thin})\left(\frac{qN_{D1}x_c}{\varepsilon_{ox}} + \frac{Q_F}{\varepsilon_{ox}}\right) \quad (4)$$

where the flat band voltage $V_{FB}$ is assumed to be $-Q_F/C_{ox}$ with $Q_F$ representing the fixed oxide charge density at the silicon—$SiO_2$ interface. To compare with the experimental results shown in FIG. 4, optically measured field oxide thicknesses between polycrystalline silicon gates and channel stops were about 820 nm (nanometers) for thick field oxides and 460 nm for thin field oxides. $Q_F$ was estimated from capacitance-voltage measurements from the wafer used in curve 430 to be in the range of 2.5 to $2.8 \times 10^{11}$ cm$^{-2}$. Substituting these values into Equation (4) yields a difference in floating potentials of 21.3 to 21.8 volts, in qualitative agreement with the experimental value of about 17 to 18 volts measured at high substrate bias voltages where the floating channel stop potential is approximately constant and where the above analysis is valid.

An assumption in the derivation of Equations (1) and (2) is that the channel stop surface region does not form an inversion layer of holes. Due to the fact that the oxide fixed charge $Q_F$ is always positive, one would expect the threshold voltage for inversion to be less than zero for high-resistivity, n-type substrates. There should be no inversion layer as long as the gate electrode of the channel stop structure is in electrical communication with a source of holes such that the potential difference between the gate and hole region is more positive than the threshold voltage. Therefore, the assumption used in the derivation of Equations (1) and (2) is a valid one.

Attempts have been made to validate the above simplified analytic model via simulation of the floating potentials using the commercially available 2-dimensional process and device simulators TSUPREM4 and MEDICI (Synopsis, Inc.).

Figure 5:
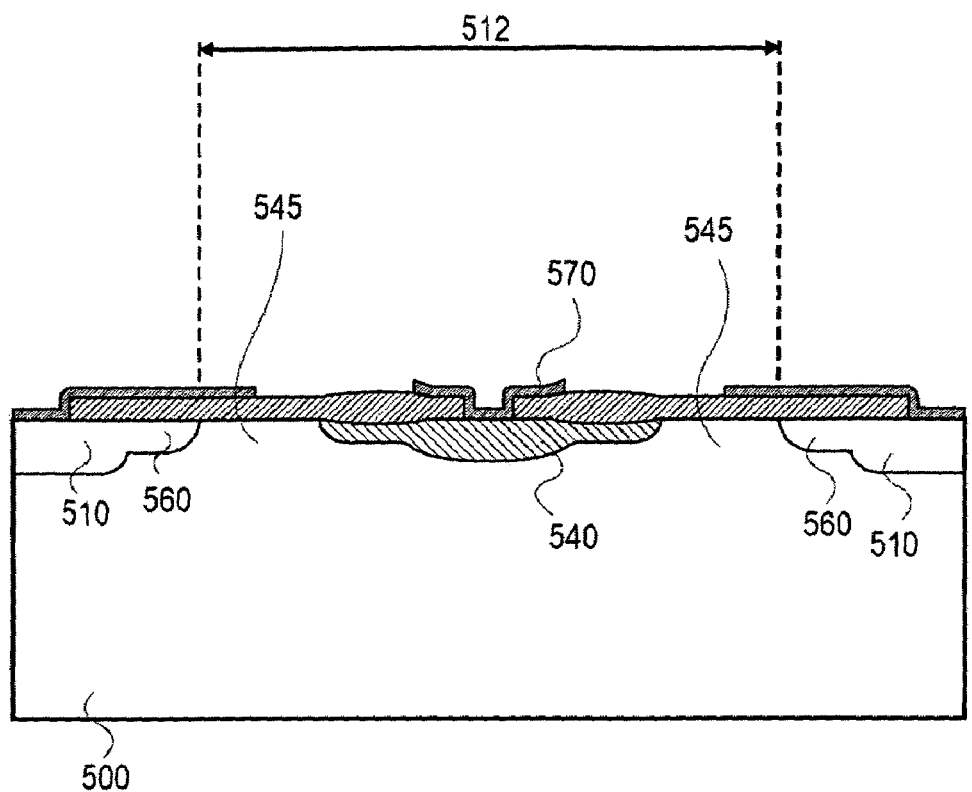
FIG. 5 is a simulation cross section showing a biased channel stop via an $n^+$ contact with biased $p^+/p$ buffer regions on either side. The metal contacts to the p+ regions are extended over the p buffer and unimplanted regions, forming field plates.

FIG. 5 is a cross section of the channel stop region showing an unimplanted gap between the n-type channel stop region and the p buffers and p+ guard rings. The cross section was generated from the commercially available process simulator TSUPREM4 (Synopsis, Inc.). FIG. 5 shows a high-resistivity substrate 500 that has p+ regions 510 and p buffers 560 on the front side. A channel stop 540 is shown in contact with a metal line 570. Regions 545 between the p buffers 560 are unimplanted. Distance between the p buffers 560 is labeled as 512.

Figure 6:
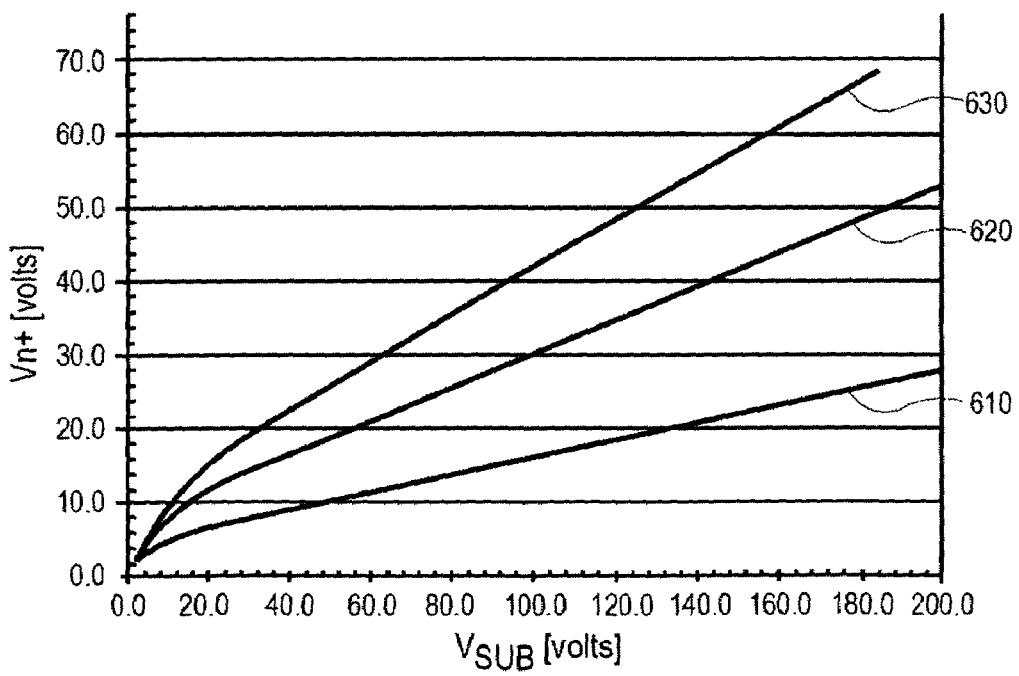
FIG. 6 is a graph showing simulated floating channel stop potential as a function of substrate bias voltage for various spacing distances between p buffer regions for the cross section of FIG. 5.

FIG. 6 shows simulated floating potentials (simulated by injecting a small current at the metal contact 570 to the channel stop 540) for various values of the distance 512 between the p buffer regions 560 and therefore reduced widths of the channel stop region 540. Curve 610 is for a 30 µm spacing; curve 620 is for a 50 µm spacing; curve 630 is for a 65 µm spacing. As can be seen, reducing the width of the channel stop region between the p buffer and p+ regions can reduce the channel stop potential. Reduction in the value of the floating potential causes a reduction in the electric field near the channel stop.

However, it is not always possible to reduce the width of the channel stop region. FIG. 7 shows a simulation cross section of a region in a CCD, where polycrystalline silicon gate electrodes, poly1 711, poly2 712, poly3 713, which form part of the imaging pixels, are contacted by metal lines 721, 722, 723, respectively. The metal lines 721, 722, 723 can bias the polycrystalline silicon gate electrodes, poly1 711, poly2 712, poly3 713, respectively, for charge storage and shifting. The metal lines 721, 722, 723 are sufficiently wide to avoid electromigration damage due to high current densities when the voltages on the polycrystalline silicon gate electrodes 711, 712, 713 are changed. For a large format CCD the charging currents can be significant due to the capacitance of the electrodes, and the metal width can be sized accordingly to avoid electromigration. Three polycrystalline silicon electrodes 711, 712, 713, as shown in FIG. 7, are typical for scientific CCDs. Multiple polycrystalline silicon layers result in an increase in the width of the channel stop, which works against reducing the surface potential.

With suitable design of the channel stop region, however, it is possible to reduce the potential even when there are polycrystalline or metal electrodes over the channel stop regions, as shown in FIG. 7. As was shown above, the potential at the surface and at the lower edge of the channel stop implant region is a weak function of substrate bias voltage once the channel stop implant is fully depleted. The value of the potential when the channel stop is fully depleted can be varied by changing the field oxide thickness and the doping level in the channel stop.

Figure 8:
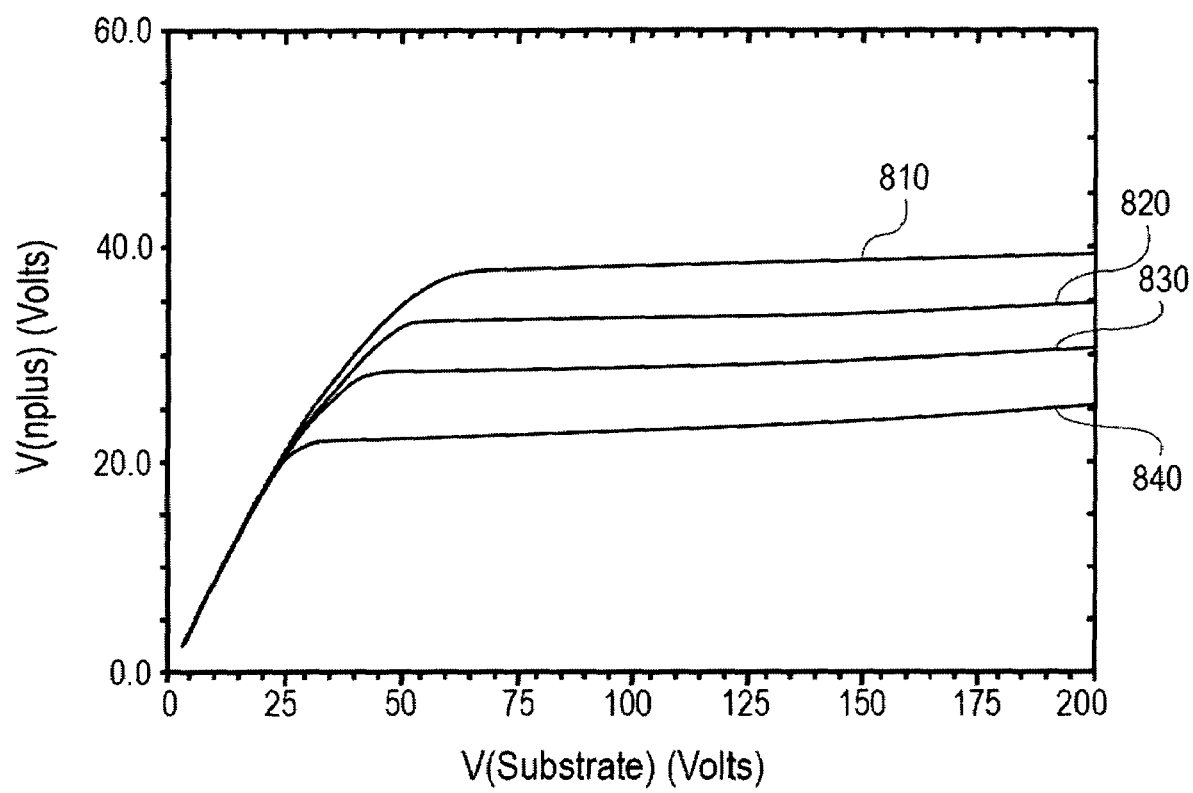
FIG. 8 is a graph of simulation results showing the floating channel stop potential as a function of substrate bias voltage for the simulation-cross section shown in FIG. 7. The field oxide thickness was 0.53 µm. The parameters varied in the simulations were the channel stop implant dose ($7.6 \times 10^{11}$ and $1.0 \times 10^{12}$ cm$^{-2}$), the fixed oxide charge density $Q_F$ ($1 \times 10^{11}$ cm$^{-2}$ and $3 \times 10^{11}$ cm$^{-2}$), and the poly1 gate voltage (0 and 5V).

Simulation cross sections were generated for two field oxide thicknesses used in actual processing. FIG. 8 shows simulated floating channel stop potentials versus substrate bias for the thinner field oxide. The simulated value of the field oxide thickness was 0.53 µm, close to the experimentally determined value of approximately 0.46 µm. The parameters that were varied in the simulation were the channel stop implant dose, the fixed oxide charge density $Q_F$, and the bias voltage on the poly1 gate electrode. The curves in FIG. 8 reflect the following values:

| In FIG. 8 | | | |
| --- | --- | --- | --- |
| Curve | $Q_F$ (cm$^{-2}$) | $V_g$ (volts) | Channel Stop Dose (cm$^{-2}$) |
| 810 | $3 \times 10^{11}$ | 5 | $1 \times 10^{12}$ |
| 820 | $3 \times 10^{11}$ | 0 | $1 \times 10^{12}$ |
| 830 | $1 \times 10^{11}$ | 0 | $1 \times 10^{12}$ |
| 840 | $1 \times 10^{11}$ | 0 | $7 \times 10^{11}$ |

One would expect the saturation region of curves 810, 820 to be shifted by the gate voltage difference in the saturation region. At a substrate bias voltage of 75V the simulated shift is 4.78V, close to the expected 5V. The shift due to $Q_F$ shown in curves 820, 830 is simply given by $\Delta V = \Delta QF/COX$, and this yields 4.92V, in fair agreement with the simulated difference at 75V of 4.69V. In addition, the expected difference in curves 830, 840 can be calculated from Equation (2). The $N_{D1}x_c$ term is equivalent to the channel stop implant dose for the case of a fully depeleted implant. The last term in Equation (2) has the dose term multiplied by the channel stop thickness $x_c$, which in this case is treated as a fitting parameter. The simulated difference due to channel stop implant dose at 75V is 6.07V, and the calculated differences are 7.76/6.83/6.36V for $x_c$ values of 1/0.5/0.25 µm, respectively. The calculated values are higher than the simulated result. However, all the results presented in FIG. 8 are in qualitative agreement with the simple model presented above. Curve 810 of FIG. 8 is in rough agreement with the experimental data shown in FIG. 4, and the values used to generate the simulated curve are close to the expected physical and electrical parameters of the CCD (e.g., field oxide thickness, channel stop dose, fixed charge density, and gate voltage).

Figure 9:
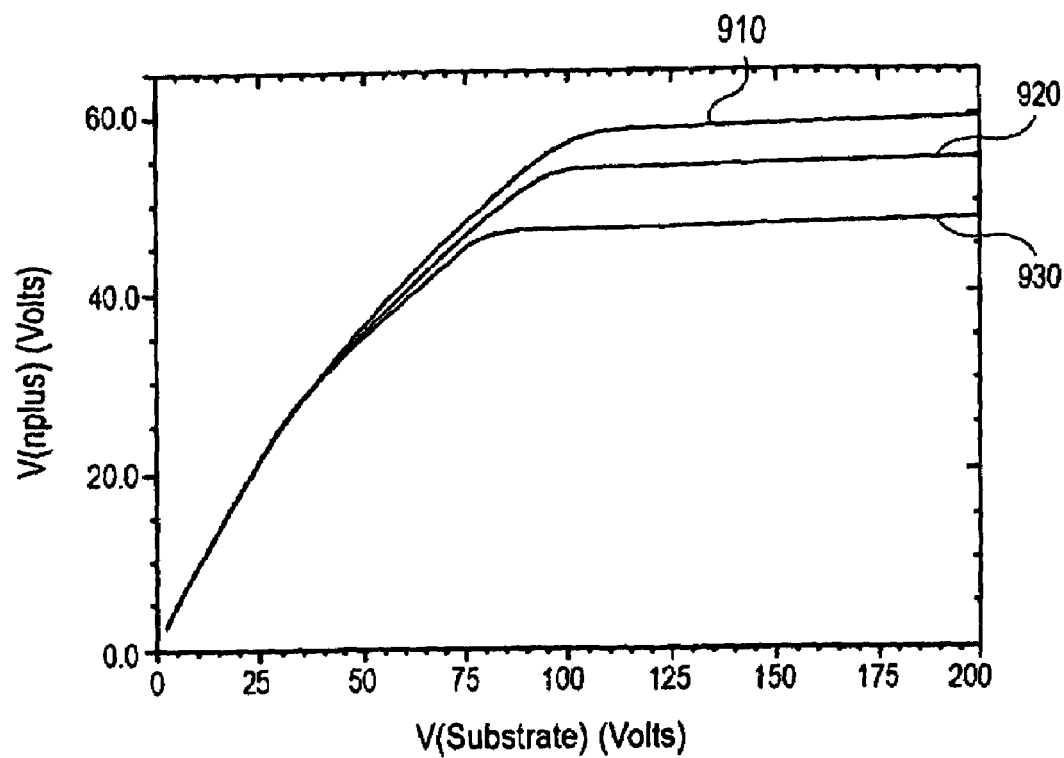
FIG. 9 is a graph of simulation results showing the floating channel stop potential as a function of substrate bias voltage for the simulation cross section shown in FIG. 7. The field oxide thickness is approximately 0.82 μm. The parameters varied in the simulations were the fixed oxide charge density $Q_F$ ($1\times10^{11}$ cm$^{-2}$ and $3\times10^{11}$ cm$^{-2}$), and the poly1 gate voltage (0 and 5V).

FIG. 9 shows simulation results for a thicker field oxide. The oxidation time input to the simulation was adjusted to grow a 0.9 μm thick field oxide, and the extracted thickness from the simulation was 0.85 μm. This is close to the experimentally determined value of approximately 0.82 μm. The extracted, integrated channel stop dose was $1.05 \times 10^{12}$ cm$^{-2}$. The curves in FIG. 9 reflect the following values:

| In FIG. 9 | | | |
|---|---|---|---|
| Curve | $Q_F$ (cm$^{-2}$) | $V_g$ (volts) | Channel Stop Dose (cm$^{-2}$) |
| 910 | $3 \times 10^{11}$ | 5 | $1 \times 10^{12}$ |
| 920 | $3 \times 10^{11}$ | 0 | $1 \times 10^{12}$ |
| 930 | $1 \times 10^{11}$ | 0 | $1 \times 10^{12}$ |

FIG. 9 shows that the thicker field oxide shifts the saturation value of the floating potential to higher values, as expected from the above model and in agreement with the experimental results shown in FIG. 4. The effects of $Q_F$ and gate voltage are again in qualitative agreement with the model, as described below.

The calculated shift in the saturated value due to $Q_F$ is 7.9V, compared to the simulated result of 6.6V at a substrate bias of 140V. The 5V shift of $V_G$ results in a simulated shift of 4.64V, again at a substrate bias of 140V. The shifts due to oxide thickness at $V_G=0V$ (calculated from Equation 4) is 16.3/19.3V compared to the simulated values of 18.66/20.74V, at $Q_F$ values of 1 and $3 \times 10^{11}$ cm$^{-2}$, respectively. In addition, Equation (2) yields saturated potential values of 40.9 and 58.4V for thin and thick oxide respectively, using extracted values for the highest curves in FIGS. 8 and 9 and assuming $x_c$ is 1 μm. The agreement between the simulation and analytic model is fairly good considering the simplicity of the 1-D model presented above. At worst case the differences are about 20%. The results are also in fair agreement with the experimental data shown in FIG. 4 at high substrate biases. At low substrate bias voltages the curves do not agree, and this is likely evidence for other parasitic static induction transistors contributing to the floating channel stop potential. The calculated surface potentials from Equation (1) for various channel stop doping levels and field oxide thicknesses are given in the following table:

| Channel stop doping (cm$^{-3}$) | Field oxide thickness (μm) | Surface potential (V) |
|---|---|---|
| $1 \times 10^{15}$ | 0.1 | 0.46 |
| $1 \times 10^{15}$ | 1.0 | 4.6 |
| $1 \times 10^{16}$ | 0.1 | 4.6 |
| $1 \times 10^{16}$ | 1.0 | 46 |
| $5 \times 10^{16}$ | 0.1 | 23.2 |
| $5 \times 10^{16}$ | 1.0 | 232 |

Useful ranges for channel stop doping and field oxide thicknesses are approximately $1 \times 10^{15}$ to $5 \times 10^{16}$ atoms/cm3 and approximately 0.1 μm-1 μm, respectively.

Channel Stop Engineering

The channel stop region can be thought of as the source region of a parasitic Static Induction Transistor (SIT). The floating potential of the parasitic SIT is such that the SIT is slightly turned on in order to drain leakage current generated in the channel stop region. Clock pulses capacitively coupled to the channel region can cause the parasitic SIT to turn on more strongly, leading to various anomalous effects, such as long time constants and hysteresis.

One embodiment of the present invention is directed to the biasing of the channel stop region a few volts above the floating potential to keep the parasitic static-induction transistor in the off condition. Minimizing the floating potential simplifies the design of the CCD in terms of accommodating the biasing of the channel stop regions, and can result in more reliable devices.

A structure for biasing a channel stop region is shown in FIG. 7. Metal line 720 is in electrical contact with channel stop region 740. It is useful to make electrical contact to the channel stop region 740 with a material that is the same conductivity type as the substrate. An external bias can be applied to the channel stop 740 through the metal line 720. Anomalous effects due to electrical floating of the channel stop region 740 can be mitigated by applying an external reverse bias voltage to the channel stop 740. The external reverse bias can eliminate the floating nature of the channel stop region 740 and prevent turning on of the parasitic SIT due to clock feed through. Current injection between the channel stop 740 and the substrate bias voltage connection 735 is inhibited. For an n-type substrate 700, the external reverse bias is slightly higher than the equilibrium floating potential. In some arrangements the external bias for n-type substrates is between approximately 0.1V and 10V. In other arrangements, the external bias for n-type substrates is between approximately 0.5V and 5V. For p-type substrates, the external reverse bias is slightly lower that the equilibrium floating potential. In some arrangements, the external bias for n-type substrates is between approximately −0.1V and −10V. In other arrangements, the external bias for n-type substrates is between approximately −0.5V and −5V.

Figure 10:
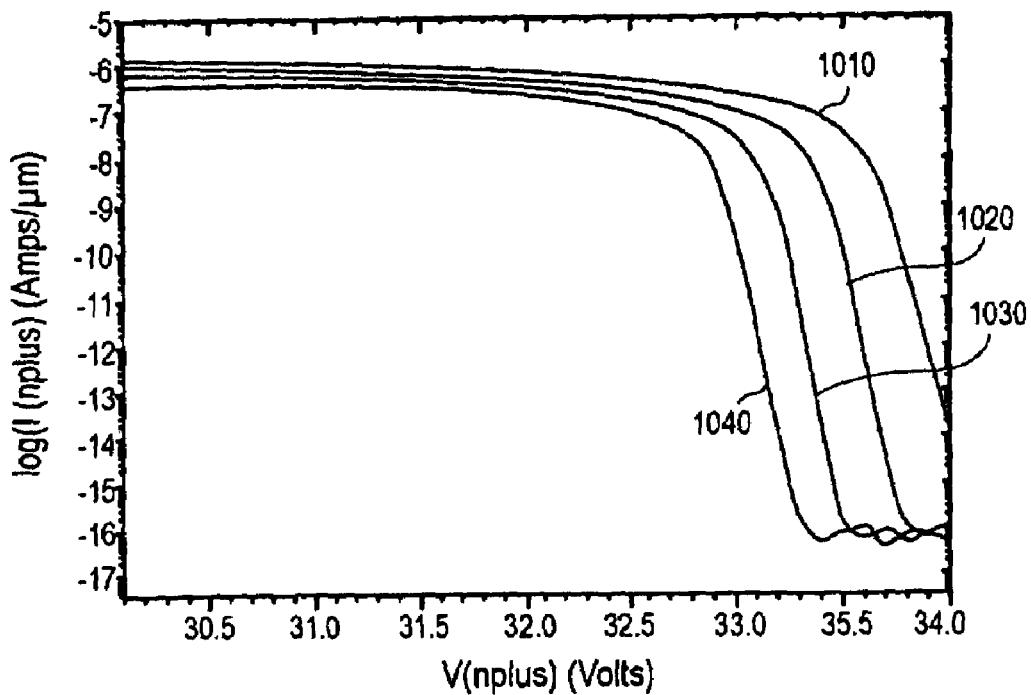
FIG. 10 is a graph of simulated channel stop current versus channel stop voltage for various values of substrate bias voltage $V_{SUB}$. The simulation cross section of FIG. 7 was used.

FIG. 10 shows simulated current-voltage characteristics for the structure of FIG. 7. The previous simulations used a current source bias of the channel stop to approximate the floating condition. For FIG. 10, the channel stop is voltage biased. The curves reflect the following bias voltages:

| In FIG. 10 | |
|---|---|
| Curve | $V_{SUB}$ |
| 1010 | 160 V |
| 1020 | 140 V |
| 1030 | 120 V |
| 1040 | 100 V |

The simulations start with a voltage bias higher than the floating potential determined from the current source bias. The channel stop voltage is then ramped to lower values.

As can be seen in FIG. 10, the parasitic static induction transistors turns on with an exponentially increasing current. The simulated current when the transistor is turned on is quite high. The current shown in FIG. 10 is per unit distance into the page for FIG. 7, and the total length of the vertical clock bus for the 3512² CCD described here is roughly 8 cm. This implies tens to hundreds of milliamps (mAs) of current flowing in the CCD substrate if the parasitic SIT is allowed to conduct. Therefore, one of the embodiments of the present invention is directed to the biasing of the channel stop to prevent turning on of the parasitic SIT. From FIG. 10 it is clear that (for an n-type substrate) biasing the channel stop region a few volts above the floating potential will be sufficient to prohibit turning on of the parasitic static induction transistor. This can be accomplished, for example, with a resistor voltage divider that is connected to the substrate bias voltage. For CCDs with substantial electrical contacting of the channel stops, a simple bypass capacitor connected to an external pin of the CCD that contacts the channel stops is sufficient for good performance. A realistic capacitor has a resistive part, which can be sufficient to bias the channel stop region via the leakage current that flows in the capacitor. The use of a substantial amount of electrical contacts to the channel stops minimizes the chances that signals capacitively coupled into the channel stop will be sufficient to turn on the parasitic static induction transistor. In some arrangements, the power supply delivering the bias voltage is current limited.

Figure 11A:
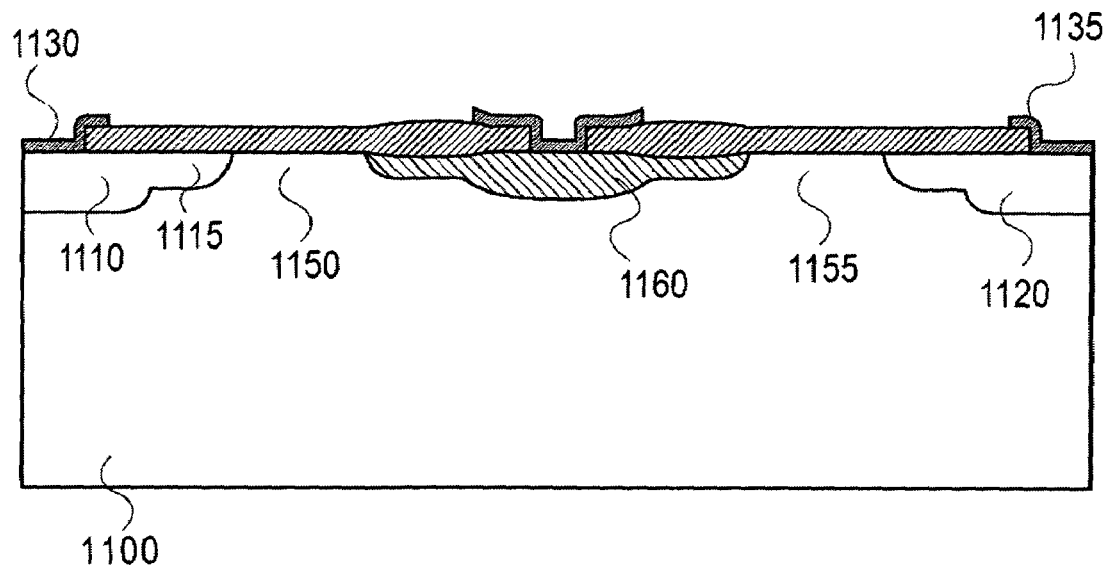
FIG. 11A shows a simulation cross section with a channel stop biased via an n$^+$ contact and having biased p$^+$/p buffer regions on either side.
Figure 11B:
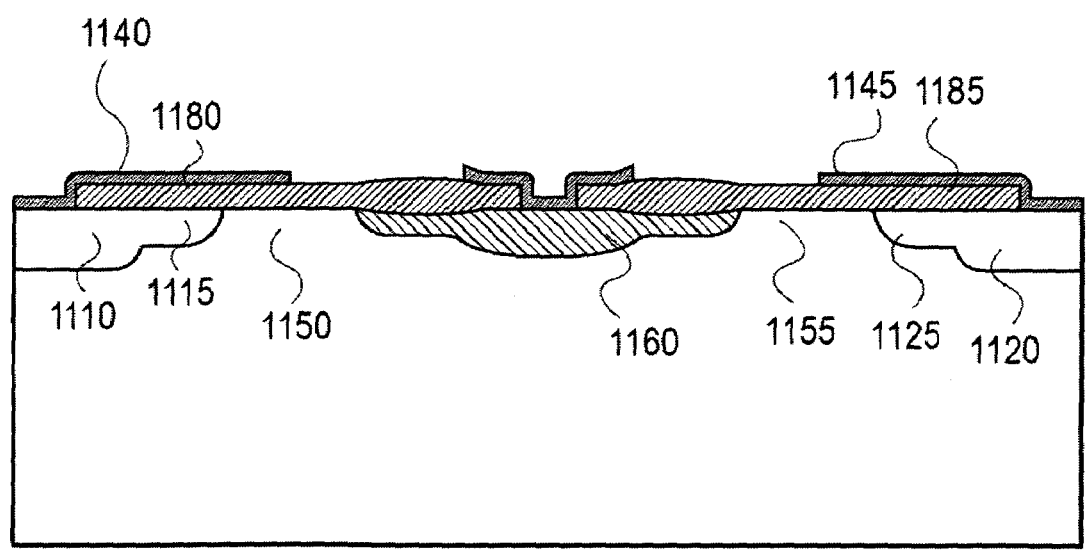
FIG. 11B shows a simulation cross section with a channel stop biased via an n$^+$ contact and having biased p$^+$/p buffer regions on either side. The metal contacts to the p+ regions are extended over the p buffer and unimplanted regions, forming field plates.

Separating channel stops from guard rings, imaging pixels (or buried channels), and output transistors with unimplanted regions to reduce surface electric fields is known. Simulation results show that the addition of p buffer regions extending beyond p⁺ implanted guard rings and transistor regions (and pixels) is useful in reducing surface fields even further. FIGS. 11A and 11B show two simulation cross sections. In FIG. 11A, the p⁺ region 1110 at the left side is biased at −22V and simulates the drain of an output transistor of a CCD. A p buffer 1115 is included adjacent the p⁺ region 1110. The right side simulates the typically grounded guard ring 1120 with p⁺ conductivity. There is no p buffer associated with the guard ring 1120 in FIG. 11A. Metal contacts 1130, 1135 to the p+ regions 1110, 1120, respectively, are also shown.

In FIG. 11B, the p⁺ region 1110 at the left side is biased at −22V and simulates the drain of an output transistor of a CCD. A p buffer 1115 is included adjacent the p⁺ region 1110. The right side simulates the typically grounded guard ring 1120 with p⁺ conductivity. There is a p buffer adjacent 1125 the guard ring 1120 in FIG. 11B. Metal contacts 1140, 1145 to the p+ regions 1110, 1120 extend beyond the p+ regions 1110, 1120, over the p buffers 1115, 1125, unimplanted regions 1150, 1155, and silicon dioxide regions 1180, 1185 respectively. The extended metal contacts 1140, 1145 form field plates that can be useful in reducing surface electric fields.

Figure 12:
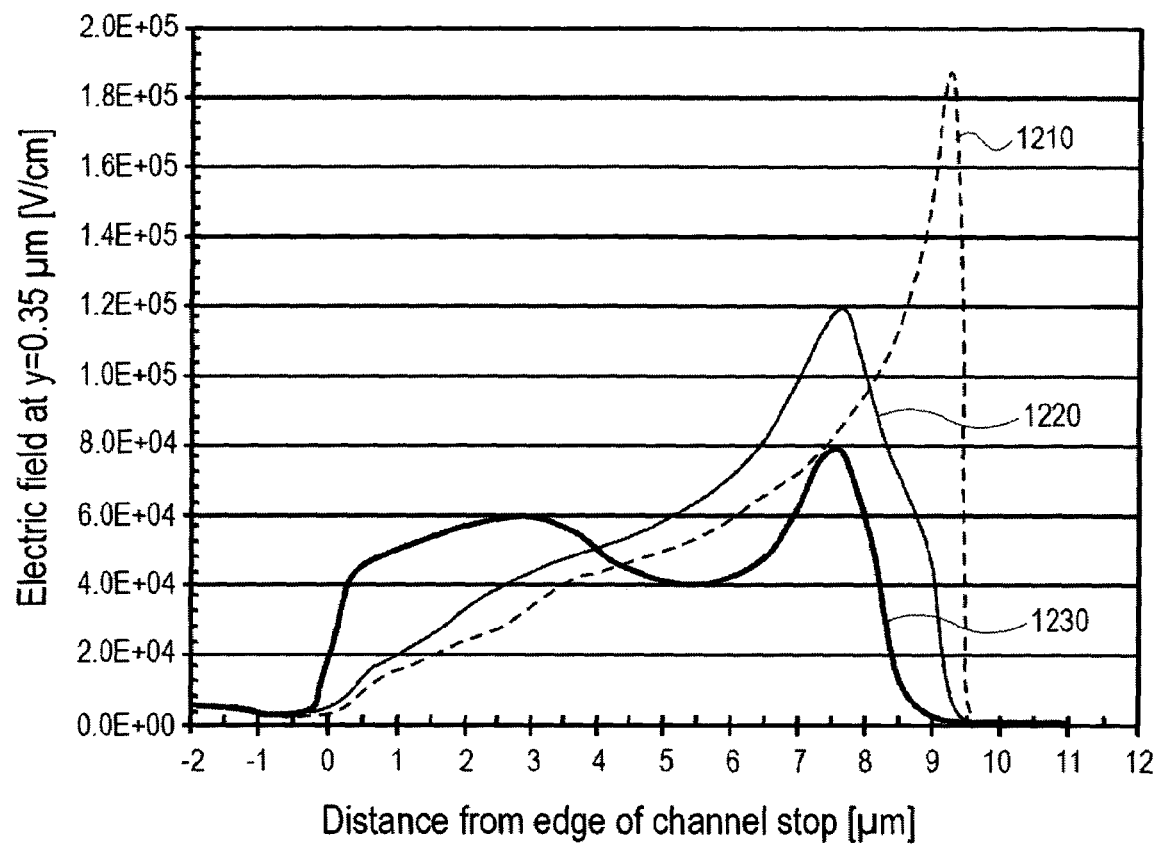
FIG. 12 is a graph of simulated electric fields for the structures shown on the right hand side in FIGS. 11A and 11B. The x-axis is relative to the edge of the channel stop.

FIG. 12 shows simulated electric fields for the right side of the structure shown in FIGS. 11A and 11B, i.e., for the region around the p+ guard ring 1120. The simulated electric fields are at a depth of 0.35 μm from the original silicon surface and are plotted as a function of lateral distance relative to the edge of the channel stop. Because silicon is consumed during oxidation, the silicon/SiO₂ surface can be at different depths depending on the oxide that was grown at a given location. The choice of 0.35 μm ensures that the field is in the silicon, but this may not necessarily give the maximum field in the silicon. The spacing between the channel stop 1160 and the p⁺ guard ring 1120 is the same (10 μm) for the simulations shown in curves 1210, 1220, 1230. For the simulations of FIG. 12 the channel stop 1160 was biased at 40V, and the substrate voltage was 100V. Parameters for the curves are shown below:

| In FIG. 12 | | |
|---|---|---|
| Curve | Structure | Maximum extracted electric field |
| 1210 | with no p buffer 1125 | 1.98 × 10⁵ V/cm |
| 1220 | with p buffer 1125 | 1.31 × 10⁵ V/cm |
| 1230 | with p buffer 1125 and field plate 1145 | 8.30 × 10⁴ V/cm |

Addition of a p buffer results in a 37% reduction in field, and the improvement continues when a field plate is added, with another 37% reduction due to the field plate alone. Combined the p buffer and field plate reduce the field by 58%. Since effects such as avalanche breakdown are exponential functions of electric field, these reductions in field are significant.

Surface fields are also a strong function of the fixed oxide charge density $Q_F$. The highest field expected in a CCD is in structures such as those 1110 shown at the left side in FIGS. 11A and 11B, where the most negative voltage in the system biases the output transistor. The peak fields were extracted from the simulation shown in FIG. 13 as follows:

$Q_F$=1×10¹¹ cm⁻²: 1.15×10⁵(no field plate)/8.66× 10⁴V/cm (field plate)

$Q_F$=3×10¹¹ cm⁻²: 1.61×10⁵(no field plate)/9.65× 10⁴V/cm (field plate)

Thus, the field plate can be quite effective in reducing the peak fields. But field plates cannot be used in every CCD because there can be interference with metal lines that are routed to bonding pads on the CCD and complications can arise.

In some embodiments of the invention which include field plates, it is possible to have the undesirable effect of inversion layer formation when metal lines cross over unimplanted regions. The threshold voltage over an unimplanted area for a CCD that fully depletes before inversion is given by $$V_T = V_{FB} - 2|\phi_N| + V_C + \frac{C_S}{C_{OX}}(-2|\phi_N| + V_C - V_{SUB}) - \frac{qN_D x_{SUB}}{2C_{OX}} \quad (5)$$

where $\phi_N$ is the band bending at inversion, $V_C$ is the channel potential, and $N_D$ is the substrate doping which is assumed uniform throughout the thickness of the CCD. $C_S$ is the silicon capacitance per unit area given by $\epsilon_{silicon}/x_{SUB}$, where $x_{SUB}$ is the substrate thickness. Since $N_D$ is extremely small in high resistivity silicon and $C_S \ll C_{OX}$, the dominant term in the expression for threshold voltage can be the flat-band voltage term $V_{FB}$, which is mainly determined by the fixed charge density $Q_F$. For a $Q_F$ value of 2.5×10¹¹ cm⁻² and $x_{OX}$ of 1.5 μm, the flat band voltage is −17.8V. High performance CCDs typically can have voltages as low as −22V, and therefore inversion of the unimplanted region would be expected for a metal line biased at this voltage and crossing over the unimplanted region and the p⁺ guard ring. An oxide thickness of about 1.5 μm assumes a field oxide of about 0.5 μm with approximately 1 μm deposited oxide between polycrystalline silicon layers and aluminum metal lines.

Figure 13A:
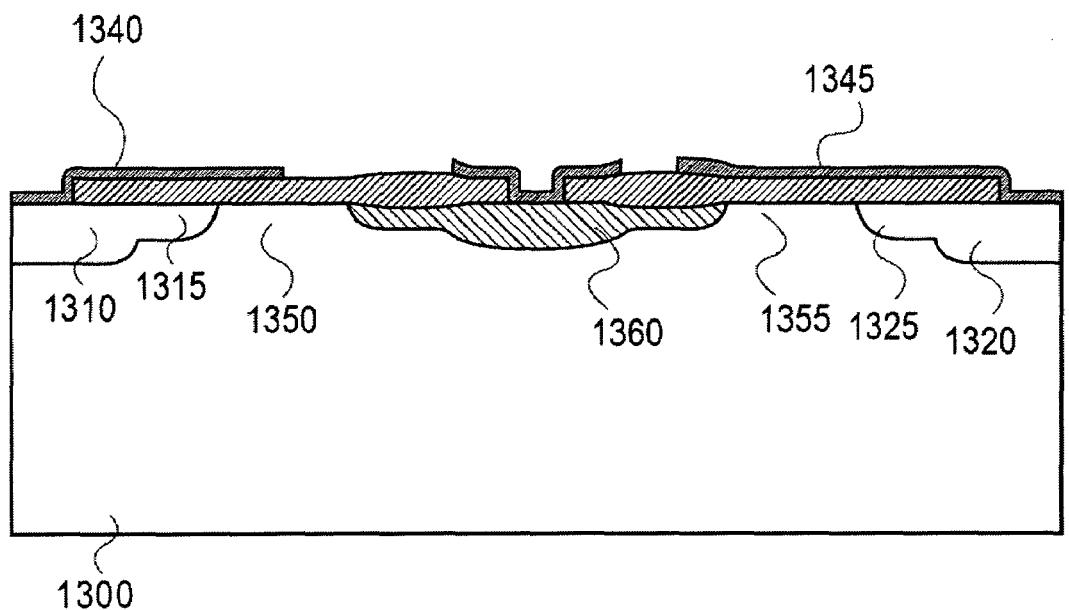
FIG. 13A shows a simulation cross section with an n$^+$ substrate contact between p$^+$ guard rings with p buffers. The metal—over the channel stop region on the right constitutes a gate electrode that can reduce the surface electric field (field plate) or cause an inversion layer to form, depending on the bias voltage. The p$^+$ region on the left is grounded by the metal overlayer.

FIG. 13A shows a simulated cross section for an n⁺ substrate 1300 with p⁺ regions 1310, 1320 that have p buffer extensions 1315, 1325, respectively, and channel stop contact 1360 biased at 40V. A metal line 1345 extends over both the p buffer 1325 and channel stop 1360. The p⁺ region 1320 is grounded and sets $V_C$ in Equation (5) to 0V.

Figure 13B:
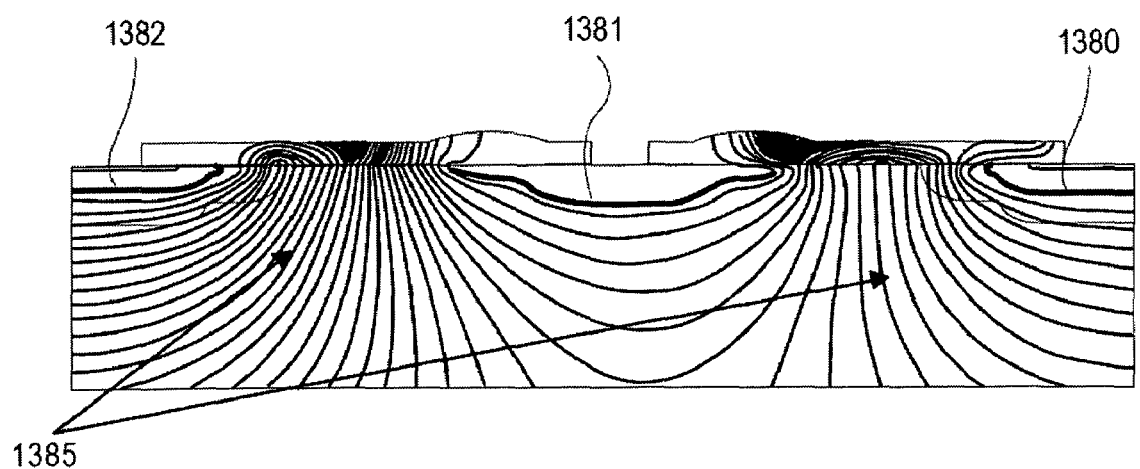
FIG. 13B shows equipotential lines spaced 2V apart for the structure in FIG. 13A when the metal overlayer on the right is biased at 6V. No inversion layer is formed.
Figure 13C:
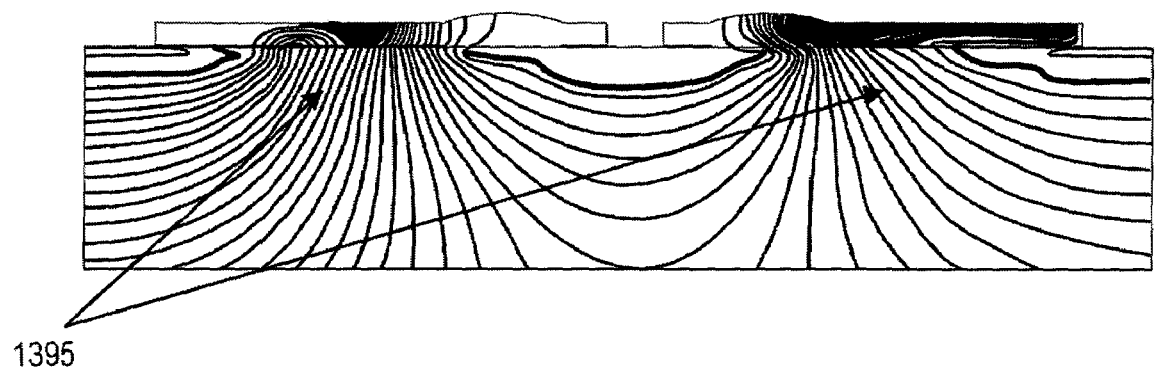
FIG. 13C shows equipotential lines spaced 2V apart for the structure in FIG. 13A when the metal overlayer on the right is biased at −22V. An inversion layer is formed.

FIG. 13B shows simulated equipotential lines 1385 in the device of FIG. 13A when the gate voltage on metal line 1345 is 6V. The p buffer 1325 is partially depleted at the surface as shown by line 1380, which indicates the depletion edge. Depletion edges 1381, 1382 are also shown for the channel stop 1360 and the p buffer 1315, respectively. The biased metal line 1345 is acting as a field plate, and is reducing the surface electric field. FIG. 13C shows simulated electric field lines in the device of FIG. 13A when the gate voltage is −22V. The electric field has increased as indicated by the closer spacing of electric field lines 1395 as compared to the electric field lines 1385 in FIG. 13B. A hole-inversion layer has formed in the unimplanted region 1355 between the n channel stop 1360 and the p buffer 1325.

Figure 14:
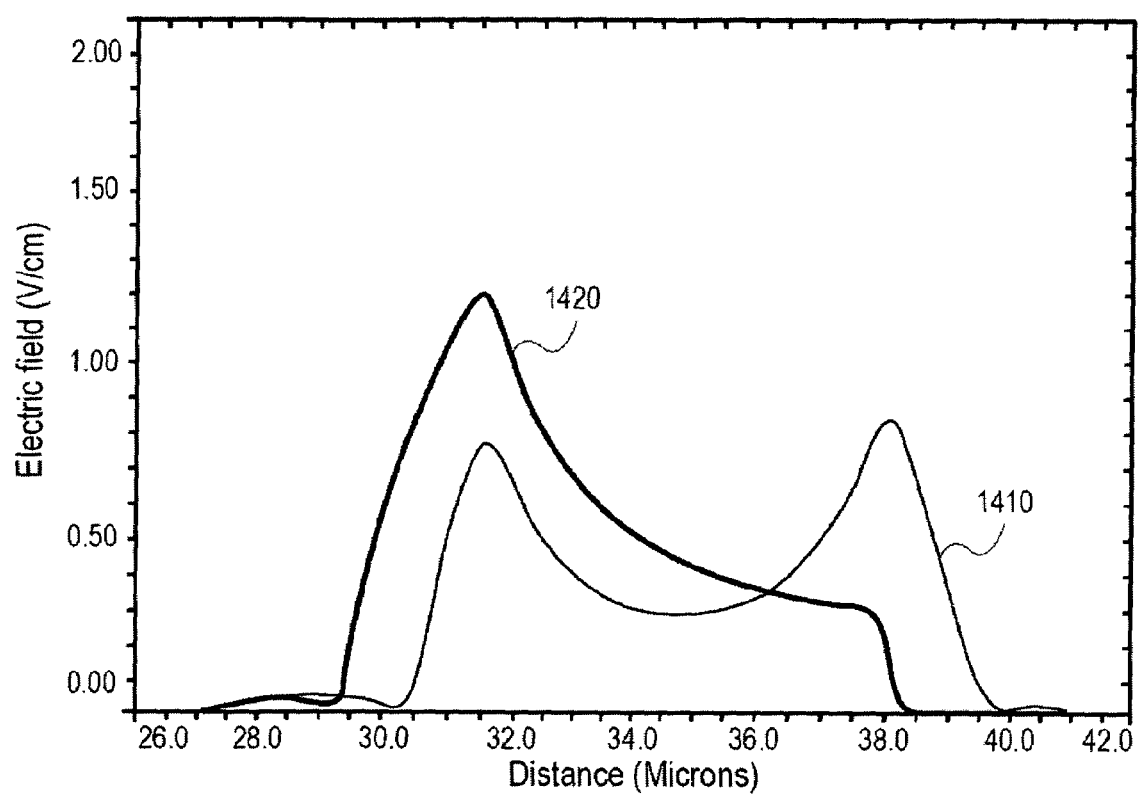
FIG. 14 shown graphs of simulated electric fields as a function of distance—for the cross section shown in FIG. 13A where the metal gate electrode of FIG. 13A begins at an ordinate value of 30.5 microns—with the metal overlayer biased at 6V and at −22V.

FIG. 14 shows the simulated electric fields at a depth of 0.34 μm from the original silicon surface at the beginning of the process simulation shown in FIGS. 13A-13C. The effect of changing the bias voltage of the metal line 1345 in FIG. 13A is shown as a function of distance where metal gate 1345 begins at an ordinate value of 31.5 μm (microns) in FIG. 14. For curve 1410, the maximum field extracted is $9.95 \times 10^4$ V/cm. For curve 1420, the maximum field extracted is $9.95 \times 10^4$ V/cm. The fields at $V_G$=6V are small and double peaked, with peaks at the channel stop 1360/unimplanted 1355 interface and in the p buffer 1325 regions. When $V_G$ is −22V the unimplanted region is inverted with holes. The field is increased by about 30% and the only peak is at the channel stop 1360/unimplanted 1355 interface.

The significantly increased field due to the hole inversion layer is undesirable. In one embodiment, hole inversion can be prevented by biasing the guard ring at a sufficiently negative voltage ($V_C$ in Equation (4)). In another embodiment, the metal lines can be shielded with underlying polycrystalline silicon as the metal lines cross over the unimplanted regions. In some arrangements, the polycrystalline silicon can be conveniently connected to the p⁺ guard ring. Since $Q_F$ is always positive, the threshold voltage will always be negative and since the "gate" (the polycrystalline silicon) and "source" (the p⁺ guard ring) are connected together, the unimplanted region will not invert. Note that this would not be true in general for an n-channel CCD fabricated on high-resistivity p-type silicon. In that case the surface of a lightly doped region would be inverted at 0V gate to source voltage due to the always-present positively charged $Q_F$. Thus it can be more straightforward to fabricate high-voltage compatible CCDs on n-type, high-resistivity silicon.

For a p-channel CCD using field plates, it is useful to minimize radiation-induced charge trapping in the field oxide as the field plate creates an electric field in the field oxide that attracts radiation-generated holes towards the field plate with no resulting change in the surface potential, which determines the surface electric field. This could be useful for space-based imagers or for other applications where the CCD is used in an ionizing radiation environment. Although the x-ray quantum efficiency would be similar for front or back-illuminated CCDs except for low x-ray energies where absorption at surfaces would occur, it is can be beneficial to operate x-ray detecting CCDs back illuminated so that the ionizing radiation buildup of charge in the oxides on the front surface of the CCD is minimized. For space-based imagers it is useful to design the CCD to withstand the increased levels of $Q_F$ that result from ionizing radiation.

From the simulation results shown in FIGS. 6, 10, and 11 it is seen that different floating potentials can result from different structural elements. For convenience in operation it can be desirable to bring all channel stop connections to a single, external pin. The potential at the exit pin is a combination of various potentials arising from different parts of the CCD. The electrical analog would be the parallel connection of different geometry static induction transistors. The transistor that is the most difficult to turn off will determine the floating potential and hence the value of channel stop bias voltage required to inhibit conduction between the channel stop and substrate contact.

Figure 15:
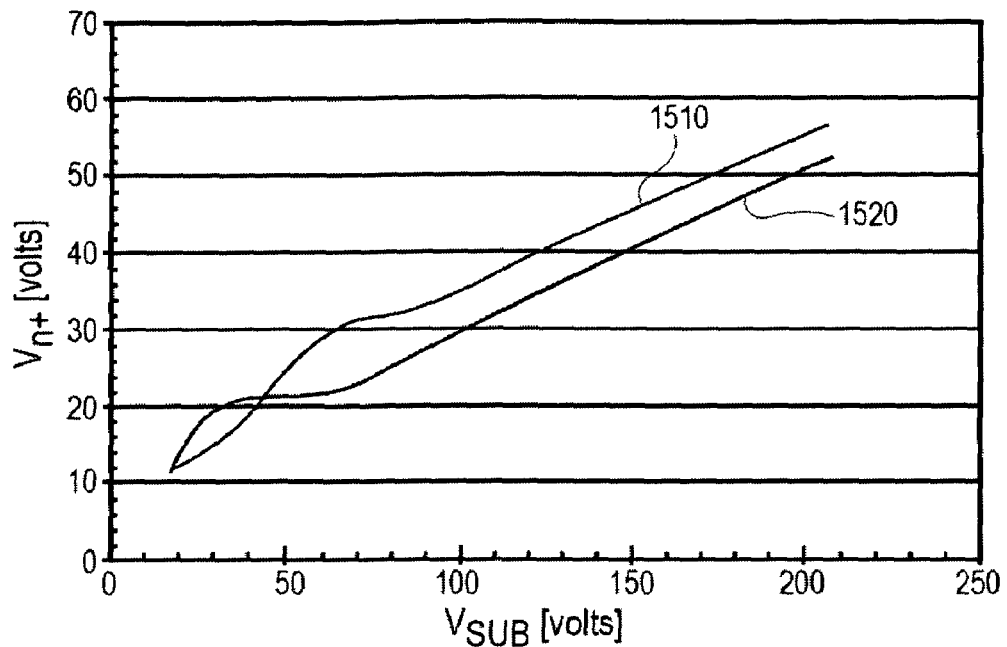
FIG. 15 shows measured floating channel stop potentials as a function of substrate bias voltage $V_{SUB}$ for 200 μm thick, CCDs with various field oxide thicknesses. The CCDs have contacts to channel stops all along the periphery of the imaging area, as well as near the output transistor and floating diffusion region.

FIG. 15 shows experimentally measured floating potentials on CCDs with fully depleted channel stops and channel stop contacts running along the periphery of the CCD image area as well as near the output transistor. The floating potentials increase initially and then are approximately constant over some range of substrate bias voltage, after which the potentials increase approximately linearly. The two curves are for CCDs with different field oxide thicknesses. The CCD for curve 1510 had a field oxide thickness of approximately 0.5 μm and the CCD for curve 1520 had a field oxide thickness of approximately 0.25 μm.

Figure 16:
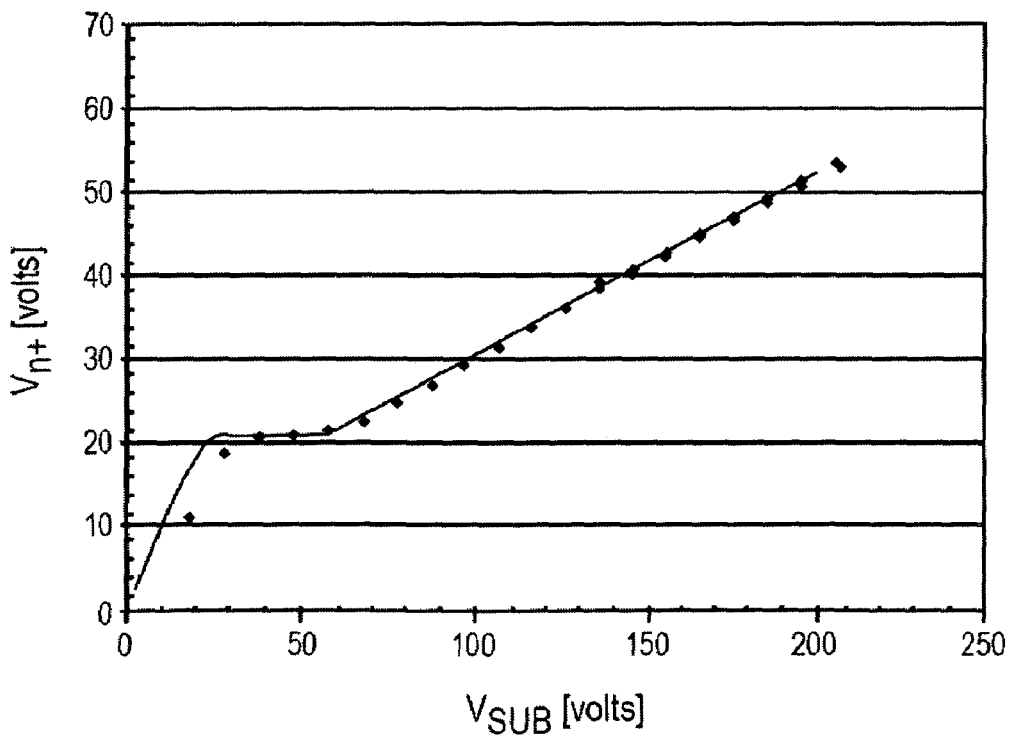
FIG. 16 shows both measured floating channel stop potentials (dots) and floating channel stop potentials from simulations (line) for CCDs with a field oxide thickness of approximately 0.25 μm.

FIG. 16 shows experimental data from CCDs compared to simulation data. The solid line representing the simulation result in FIG. 16 was generated by taking the maximum of two simulated potentials, one each from FIGS. 6 and 8. At low voltages the SIT that is the most difficult to turn off arises from the structure of FIG. 7, but this is overtaken at a substrate bias voltage of about 60V by the parasitic SIT from FIG. 6. The curves in FIGS. 15 and 16 suggest that the devices may be affected by a combination of parasitic SITs arising from different parts of the devices.

The results shown in FIGS. 15 and 16 differ significantly from those of FIG. 9. It may be that the more substantial contacting of channel stop regions for the CCDs shown in FIGS. 15 and 16 has resulted in a low impedance connection between the parasitic static induction transistors represented in FIGS. 5 and 7. There was no low impedance connection in the CCDs of the type reported in FIG. 9; the connection was added in the new CCD design due to try to mitigate anomalous effects that were observed in the older devices. The addition of biased channel stops near the output transistor as done on the CCDs of FIGS. 15 and 16 have greatly reduced the anomalous effects. FIG. 16 indicates that reducing the channel stop width near the output transistor can result in even lower channel stop potentials, thereby allowing for reliable operation at even higher bias voltages than considered so far. For example, reducing the channel stop width to 30 μm may result in a floating potential of approximately 20V up to a substrate bias of about 130V, after which the parasitic SIT of FIGS. 5 and 6 will determine the floating potential.

The measurements and simulation results described above show that by proper channel stop engineering according to the embodiments of the present invention, the floating potential of the channel stops can be changed. This has been experimentally verified on large format CCDs by varying the field oxide thickness and location of electrical connections to the channel stop regions. The analysis of the experimental and simulation results suggest using structures that reduce the floating potential and therefore allow for simpler CCD designs and more reliable devices.

In the embodiments of the present invention, the metal pads that are wire or bump bonded to provide electrical connection to the bias, clocking, and readout circuitry are typically formed over a field oxide layer. When surrounded by p+ regions there is the potential for merged depletion regions under the pads resulting in a floating channel stop region with the possibility of capacitive coupling into the CCD. In the embodiments of the present invention, a polycrystalline silicon layer that is connected to the nearby p+ regions that are typically grounded is added under the metal bonding lads. This results in full depletion of the channel stops under the metal bonding pad. In addition, this also results in electrical shielding of the metal from any disturbances in the channel stop region due to the DC-biased polycrystalline silicon layer.

A high-voltage compatible CCD in accordance with the embodiments of the present invention, as described above, may include any one or more or a combination of the following novel features for a CCD with buried channel pixels (having a conductivity type opposite to that of the substrate) and a nearby biased guard ring having a conductivity type opposite to that of the substrate:

1) adjusting voltages at guard rings, CCD gates, output transistors, etc. and the substrate bias to merge associated depletion regions;
2) forming contact regions to the channel stop that are of the same conductivity type as the substrate by heavily doping a region connected to the channel stops with dopants of the same conductivity type as the substrate and allowing for electrical connection to this contact;
3) when the substrate is n-type, biasing the channel stop regions, which have the same conductivity type as the substrate and are located above the merged depletion regions, at a potentials slightly higher than the equilibrium floating potentials of the channel stops in order to inhibit current injection between the channel stop and substrate bias voltage connection;
4) when the substrate is p-type, biasing the channel stop regions, which have the same conductivity type as the substrate and are located above the merged depletion regions, at a potentials slightly lower than the equilibrium floating potentials of the channel stops in order to inhibit current injection between the channel stop and substrate bias voltage connection;
5) using field plates, buffers and unimplanted regions to safely drop the voltage between the biased guard-ring regions (having a conductivity type opposite to that of the substrate) and the heavily doped contacts to the channel stops;
6) where polycrystalline silicon or metal electrodes overlap un-implanted regions (surface regions of the substrate not intentionally doped) that are next to heavily doped regions having a conductivity type opposite to that of the substrate and/or buffer regions having a conductivity type opposite to that of the substrate and extending beyond heavily doped regions having a conductivity type opposite to that of substrate, using biased polycrystalline silicon gate electrodes or metal electrodes under the polycrystalline silicon or metal lines to prevent surface inversion and/or field enhancement when the conditions for surface inversion exist (voltage difference between the polycrystalline silicon or metal lines and region of doping opposite to that of the substrate exceeding in magnitude the threshold voltage of the parasitic MOS transistor formed by the above combination(s));
7) fabricating the CCD on n-type silicon to avoid inversion layers over unimplanted regions;
8) minimizing the widths of channel stop region between guard ring regions to reduce the floating channel stop potential;
9) biasing gate electrodes, channel stop regions, and the substrate connection to effect full depletion of the channel stops in order to reduce the floating channel stop potential;
10) using polycrystalline silicon for the gate electrodes of 10) and making the gate electrodes of sufficient width to cause saturation of the floating potential;
10) doping regions connected to the channel stop regions with dopants having the same conductivity type as the substrate to avoid depletion under metal lines and the formation of floating regions; and
12) forming a contact to the channel stop as in 2) above close to the output amplifier of the CCD to improve performance.

Although the novel features disclosed herein have been described for CCD applications related to imaging, others will recognize that the novel embodiments are also equally applicable for non-imaging applications, such as, for example, power semiconductor devices requiring merged depletion regions. Other areas where the embodiments of the present invention may be used also include: small pixel, scientific CCDs where good PSF is required, space-based imaging where reliability is of prime importance, and direct detection of x-rays with applications in materials science, medical imaging, x-ray astronomy and other fields. Furthermore, photodiode arrays, CMOS imagers, and hybrid imagers where detector arrays are connected to CMOS readouts can also benefit from the techniques described above when merged depletions are required. In particular, the embodiments described above provide novel enhancements by incorporating structures such as merged depletion regions, fully depleted channel stops, and channel stop engineering to reduce surface potentials and electric fields in semiconductor devices with general utility to not only imaging devices but other devices that operate with merged depletion regions.

As will be understood by those skilled in the art, the present invention may be embodied in other specific forms without departing from the essential characteristics thereof. These other embodiments are intended to be included within the scope of the present invention, which is set forth in the following claims.

I claim:

1. A charge coupled device for detecting electromagnetic and particle radiation, comprising:
a high-resistivity, semiconductor substrate having a front side and a back side, the substrate having a first conductivity type;
a plurality of buried channel regions on the front side of the substrate for collecting signal charge produced in the substrate by incident radiation, the channel regions having a second conductivity type, the second conductivity type opposite the first conductivity type;
gate electrode circuitry patterned on the front side of the substrate for transfer and storage of the signal charge;
amplifier circuitry for receiving signal charge transferred by the gate electrode circuitry;
a first voltage source connected to the substrate and configured for forming depletion regions within the substrate, and for creating a drift electric field in the substrate to transport the signal charge to the channel regions;
a guard ring having the second conductivity type and connected to a second voltage source, a portion of the guard ring positioned approximately 1 µm to 100 µm from at least one channel region;

a channel stop having the first conductivity type and having higher doping than the substrate, the channel stop disposed near the front side of the substrate and covered by a field oxide layer, the channel stop connected to a third voltage source; and a polysilicon electrode over the field oxide and the channel stop, the polysilicon electrode connected to a fourth voltage source.

2. The device of claim 1 further comprising an unimplanted region between the guard ring and the channel stop.

3. The device of claim 2, further comprising a buffer region having the second conductivity type and having lighter doing than the guard ring, the buffer region positioned between the guard ring and the unimplanted region.

4. The device of claim 3, further comprising a metal or polysilicon line over the guard ring, the buffer region, and the unimplanted region, the line connected to the guard ring.

5. The device of claim 3, further comprising a polysilicon layer connected to the guard ring, the polysilicon layer extending over at least a portion of the buffer region, the unimplanted region, and a portion of the channel stop, wherein the polysilicon layer lies below a biased metal line.

6. The device of claim 1, further comprising at least a portion of the guard ring positioned approximately 1 µm to 70 µm from the amplifier circuitry.

7. The device of claim 1 wherein the channel stop has an equilibrium floating potential and the third voltage source supplies a voltage higher than the equilibrium floating potential when the first conductivity type is n-type.

8. The device of claim 1 wherein the channel stop region has an equilibrium floating potential and the third voltage source supplies a voltage lower than the equilibrium floating potential when the first conductivity type is p-type.

9. The charge coupled device of claim 1 wherein the channel stop has a doping between about $1\times10^{15}$ and $5\times10^{16}$ atoms per cubic centimeter.

10. The charge coupled device of claim 1 wherein the channel stop has a doping between about $9\times10^{15}$ and $2\times10^{16}$ atoms per cubic centimeter.

11. The charge coupled device of claim 1 wherein the field oxide layer has a thickness between about 0.05 µm and 1.0 µm.

12. The charge coupled device of claim 1 wherein the field oxide layer has a thickness between about 0.1 µm and 0.5 µm.

* * * * *